US010429452B2

(12) United States Patent
Yoshiya

(10) Patent No.: US 10,429,452 B2
(45) Date of Patent: Oct. 1, 2019

(54) ROTATION DETECTION DEVICE

(71) Applicant: Melexis Technologies SA, Bevaix (CH)

(72) Inventor: Takumi Yoshiya, Tokyo (JP)

(73) Assignee: Melexis Technologies SA, Bevaix (CH)

( * ) Notice: Subject to any disclaimer, the term of this patent is extended or adjusted under 35 U.S.C. 154(b) by 31 days.

(21) Appl. No.: 15/806,626

(22) Filed: Nov. 8, 2017

(65) Prior Publication Data

US 2018/0128882 A1 May 10, 2018

(30) Foreign Application Priority Data

Nov. 9, 2016 (JP) ................................. 2016-218563

(51) Int. Cl.
*G01R 33/00* (2006.01)
*G01D 5/16* (2006.01)
*G01D 5/14* (2006.01)

(52) U.S. Cl.
CPC ......... *G01R 33/0035* (2013.01); *G01D 5/147* (2013.01); *G01D 5/16* (2013.01)

(58) Field of Classification Search
CPC ......... F01B 1/00; F01B 2170/00; H03H 1/00; H03H 2210/00
See application file for complete search history.

(56) References Cited

U.S. PATENT DOCUMENTS

2007/0273364 A1* 11/2007 Takei .................... G02B 7/102
  324/207.2
2012/0194175 A1* 8/2012 Ausserlechner ..... G01D 5/2451
  324/207.14

2013/0335067 A1* 12/2013 Dwyer ..................... G01D 3/08
  324/207.11
2014/0225596 A1* 8/2014 Nakamura ............. G01R 33/07
  324/207.2
2015/0331070 A1* 11/2015 Koeck .................... G01D 5/145
  324/252

(Continued)

FOREIGN PATENT DOCUMENTS

JP      2015215342 A    12/2015
WO      2016136574 A1    9/2016

OTHER PUBLICATIONS

EP Search Report from EP Application No. 17200702.3, dated Mar. 27, 2018.

*Primary Examiner* — Jermele M Hollington
*Assistant Examiner* — Temilade S Rhodes-Vivour
(74) *Attorney, Agent, or Firm* — Workman Nydegger

(57) ABSTRACT

A rotation detection device includes a rotatable body having a tooth tip and a tooth bottom on planes normal to a rotation axis direction, a magnet forming a magnetic field toward the tooth surfaces of the tooth tip and bottom, a magnetic detection element disposed between the rotatable body and the magnet and other than on the rotation axis of the rotatable body, and detecting the magnetic flux densities in the rotation axis direction of the rotatable body at at least two positions, and a magnetic sensor having a signal processor for calculating the rotation angle of the rotatable body according to difference between the magnetic flux densities in the rotation axis direction detected at two positions and difference between the magnetic flux densities in the direction perpendicular to the rotation axis direction and a radial direction of the rotatable body detected at two positions by the magnetic detection element.

1 Claim, 11 Drawing Sheets

(56) References Cited

U.S. PATENT DOCUMENTS

2016/0216133 A1 7/2016 Ausserlechner
2017/0356761 A1* 12/2017 Vig .................. G01D 5/147
2018/0031392 A1 2/2018 Yoshiya

* cited by examiner

ROTATION DETECTION DEVICE

TECHNICAL FIELD OF THE INVENTION

The present invention relates to a rotation detection device.

BACKGROUND OF THE INVENTION

As a conventional technique, there has been proposed a rotation detection device for detecting the rotation angle of a rotating body by counting the passage of gear teeth provided on the rotating body (for example, see JP 2015-215342 A).

The rotation detection device disclosed in JP 2015-215342 A includes a cylindrical bias magnet, three magnetoresistive elements to detect the magnetic field which changes when the gear teeth provided on the rotating body passes as the rotating body rotates, a detecting section for detecting differential signals each from two outputs of the three magnetoresistive elements, an amplitude adjusting section for adjusting the amplitudes of the differential signals detected by the detecting section so as to cause the amplitudes of the respective differential signals to coincide with each other, and a difference value acquiring section for acquiring a difference value of each of the differential signals whose amplitudes have been adjusted by the amplitude adjusting section, a determination circuit section for generating a binary signal based on a threshold value from the difference value acquired by the difference value acquiring section, and counts the passage of the gear teeth on the basis of the waveform of the binary signal generated by the determination circuit section and detects the rotation angle of the rotating body. When the three magnetoresistive elements are arranged to be tilted with respect to the symmetry of the magnetic flux generated by the cylindrical bias magnet, the amplitude of one of the differential signals is large and that of the other is small, so that the amplitudes are different. However, since the amplitudes are adjusted to coincide with each other by the amplitude adjusting section, the binary signal accords with the passage of the gear teeth.

SUMMARY OF THE INVENTION

However, even when the three magnetoresistive elements are arranged to be inclined with respect to the symmetry of the magnetic flux generated by the cylindrical bias magnet in the rotation detection device disclosed in JP 2015-215342 A, a binary signal corresponding to the passage of the gear teeth can be obtained so that the calibration of the rotation detection device becomes unnecessary. However, since the rotation detection device only outputs the binary signal and therefore only counts the passage of the gear teeth, the resolution of the rotation angle of the rotating body is limited, which causes a problem that the rotation angle cannot be detected continuously.

Therefore, an object of the present invention is to provide a rotation detection device for continuously detecting the rotation angle of a rotating body.

The above objective is accomplished by a device according to the present invention.

In order to achieve the above objective, an embodiment of the present invention provides the following rotation detection device.

A rotation detection device according to embodiments of the present invention includes:

a rotatable body made of a soft magnetic material and having a tooth tip and a tooth bottom on planes normal to a direction of a rotation axis, the tooth tip being provided in a range of a first rotation angle, the tooth bottom being provided in a range other than the range of the first rotation angle;

a magnet configured to form a magnetic field toward tooth surfaces of the tooth tip and the tooth bottom of the rotatable body;

a magnetic detection element disposed at a position between the rotatable body and the magnet and other than on the rotation axis of the rotatable body, and configured to detect magnetic flux densities in the direction of the rotation axis of the rotatable body at at least two positions; and a magnetic sensor having a signal processor configured to calculate a rotation angle of the rotatable body in accordance with a difference between magnetic flux densities in the direction of the rotation axis of the rotatable body, detected at the at least two positions and a difference between magnetic flux densities in a direction perpendicular to the direction of the rotation axis and a radial direction of the rotatable body, detected at the at least two positions by the magnetic detection element.

In the rotation detection device according to embodiments of the present invention, the signal processor of the magnetic sensor may be configured to set a first correction value based on an signal output from the magnetic detection element when a distance between the tooth surfaces of the rotatable body and the magnetic detection element is infinite, to make correction of an output value of the magnetic detection element by using the first correction value, to set a second correction value based on an amplitude of the output value when one or more revolutions of the rotatable body is made after the correction of the output value, to make correction of the difference between the magnetic flux densities in the direction of the rotation axis of the rotatable body, detected at the at least two positions by the magnetic detection element, by using the first correction value, to make correction of the difference between the magnetic flux densities in the direction perpendicular to the direction of the rotation axis and the radial direction of the rotatable body, detected at the at least two positions, by using the second correction value, and to calculate the rotation angle of the rotatable body in accordance with a value obtained by the correction of the difference by using the first correction value and a value obtained by the correction of the difference by using the second correction value.

According to a first aspect of the present invention, the rotation angle of the rotatable body can be continuously detected.

According to a second aspect of the present invention, the increase in the calibration procedures can be suppressed.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which.

Figure 1:
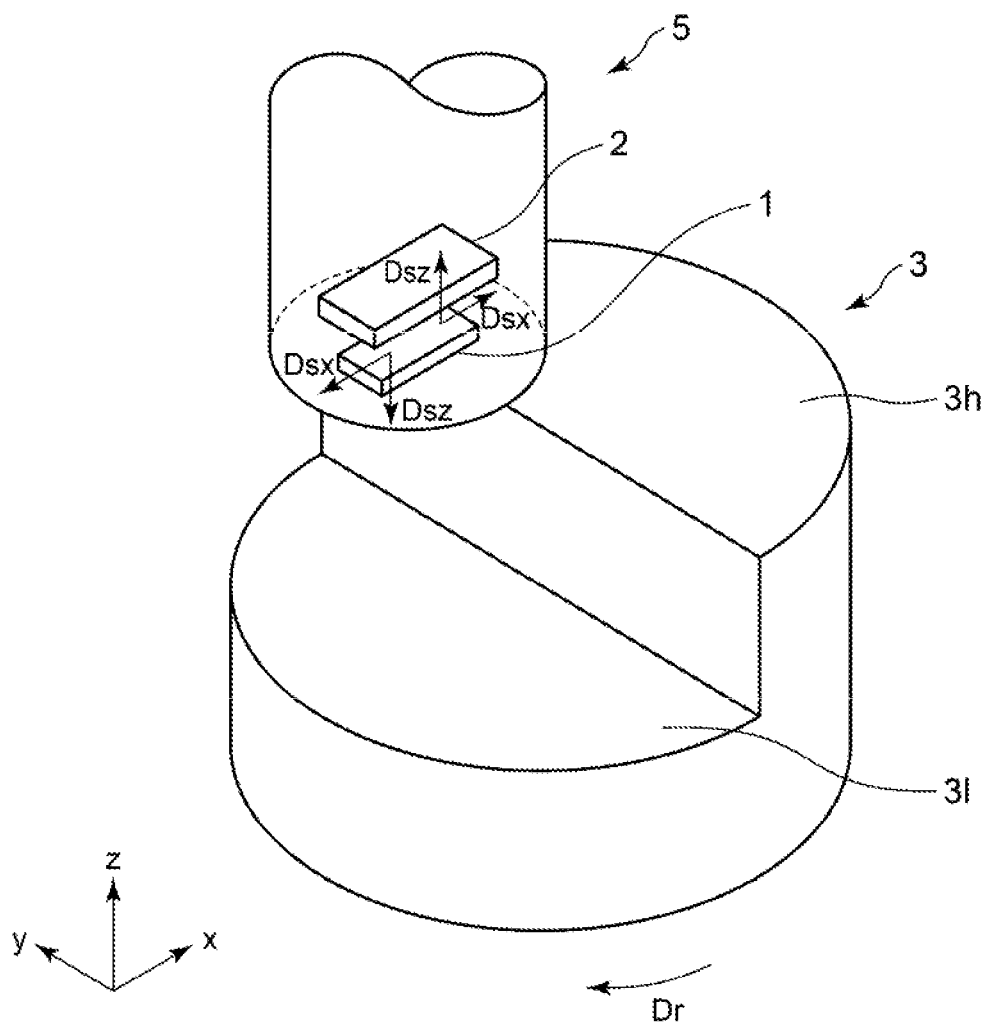
FIG. 1 is a side view showing a configuration example of a rotation detection device according to an embodiment of the present invention.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, directional terminology such as top, bottom, front, back, leading, trailing, under, over and the like in the description and the claims is used for descriptive purposes with reference to the orientation of the drawings being described, and not necessarily for describing relative positions. Because components of embodiments of the present invention can be positioned in a number of different orientations, the directional terminology is used for purposes of illustration only, and is in no way intended to be limiting, unless otherwise indicated. It is, hence, to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

[Embodiment]
(Configuration of Rotation Detection Device)

Figure 2A:
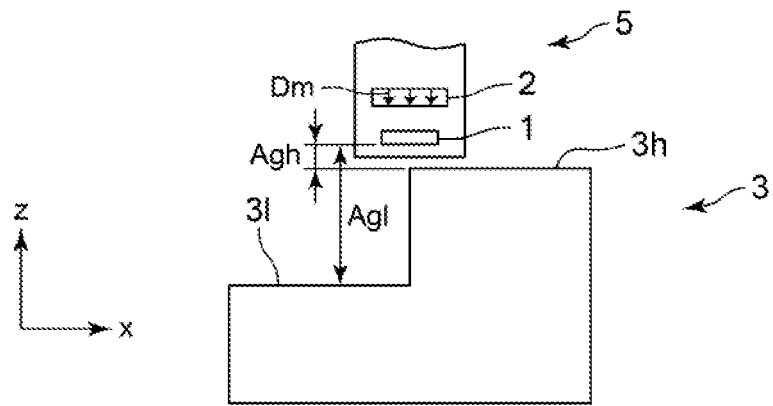
FIGS. 2(a) to 2(c) are a front view, side view, and plan view, respectively, showing the configuration of the rotation detection device according to embodiments of the present invention.
Figure 2B:
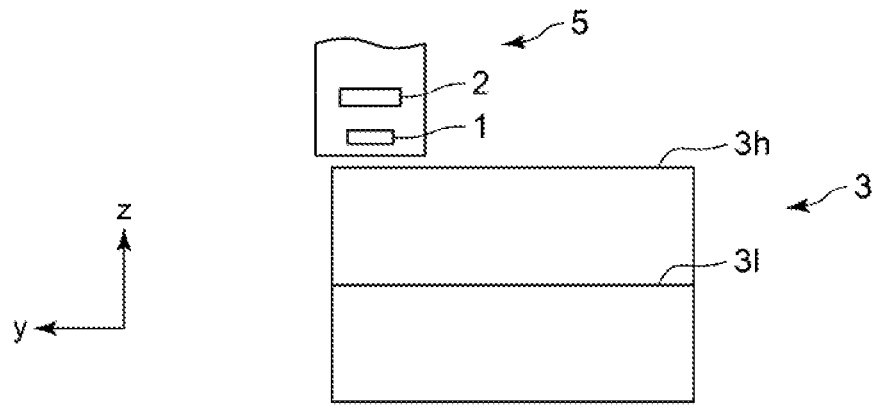
Figure 2C:
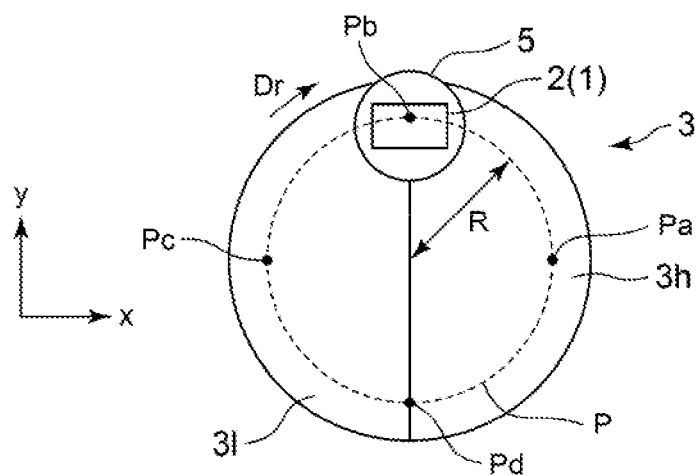
Figure 3A:
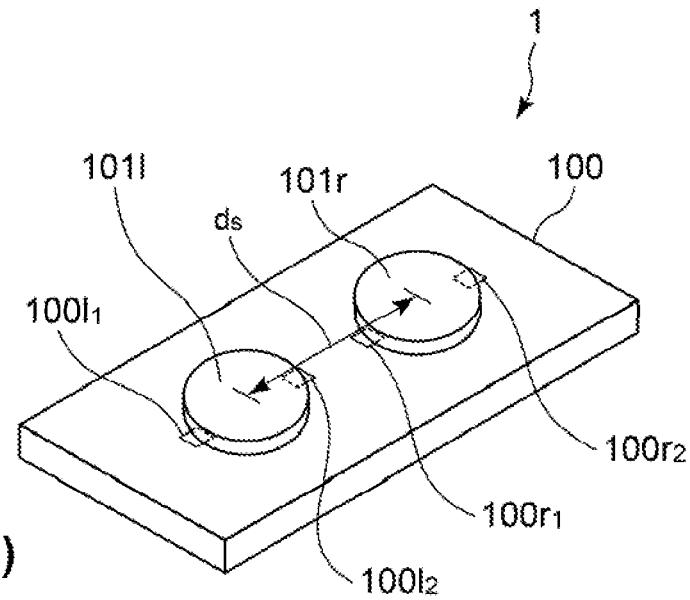
FIGS. 3(a) and 3(b) are a perspective view and a cross-sectional view showing a configuration of a magnetic sensor that may be used in a rotation detection device according to embodiments of the present invention.
Figure 3B:
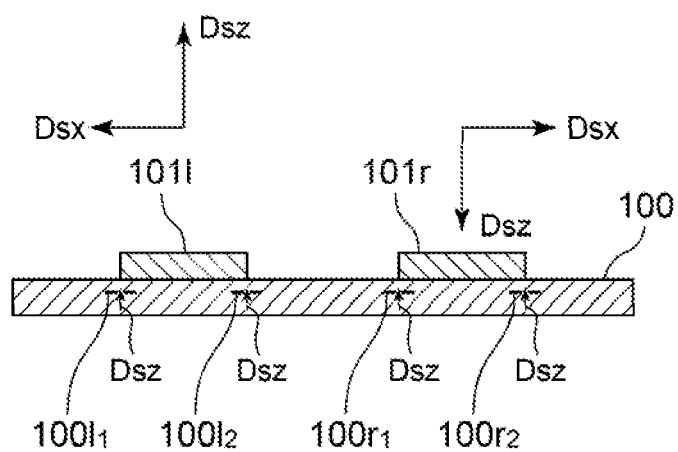

FIG. 1 is a side view showing a configuration example of a rotation detection device according to embodiments of the present invention. FIGS. 2(a) to 2(c) are front, side and plan views, respectively, showing the configuration of the rotation detection device. FIGS. 3(a) and 3(b) are a perspective view and a cross-sectional view, respectively, showing the configuration of the magnetic sensor.

A rotation detection device 5 includes a magnetic sensor 1 arranged with an air gap $A_{gh}$ between the magnetic sensor 1 and a tooth tip 3h of a rotatable body 3, and a magnet 2 arranged on the back surface side (substrate 100 side) of the magnetic sensor 1 with the magnetization direction as $D_m$. The magnetic sensor 1 and the magnet 2 are molded with a resin or the like.

The magnet 2 is a permanent magnet formed using materials such as for instance ferrite, samarium cobalt, and neodymium. The magnet 2 may have a quadrangular shape in plan view as illustrated as an example, but it may also have any other suitable shape, such as for instance a circular shape. The size of the magnet is 10 mm in diameter×5 mm in height as an example, but can be changed as necessary to adjust the magnetic field to be applied in accordance with the size of the magnetic sensor 1.

The rotatable body 3 is formed using a soft magnetic material. It is arranged for rotating in a rotation direction $D_r$ with the z-axis direction as the rotation axis direction. The tooth tip 3h has a shorter distance from the magnetic sensor 1, compared to a tooth bottom 3l that has a longer distance therefrom. Although various sizes can be adopted, here as an example, it is assumed that the radius is 2.5 mm, the distance from the magnetic sensor 1 to the tooth tip 3h satisfies $A_{gh}$=2 mm, the distance from the magnetic sensor 1 to the tooth bottom 3l satisfies $A_{gl}$=5 mm, and the position where the magnetic sensor 1 is placed is apart from the rotation axis in the radial direction by a distance R satisfying R=2 mm. In the rotatable body 3, the boundary between the tooth tip 3h and the tooth bottom 3l is a plane perpendicular to the surfaces of the tooth tip 3h and the tooth bottom 3l as shown in the figures, but as long as the output of the magnetic sensor 1 described later is obtained, the boundary does not need to be a perpendicular plane, and may for instance be a curved surface connecting both sides continuously. Incidentally, the tooth tip 3h has an angle range (range of the first rotation angle) of 180° and the tooth bottom 3l has an angle range of 180°, but these ranges may be changed as needed. Also, the rotatable body 3 may be rotated while connected to a rotating object to be detected.

As shown in FIGS. 3(a) and 3(b), the magnetic sensor 1 is a Hall IC that detects magnetic flux densities in x direction and z direction, which includes, as an example, a flat plate-shaped substrate 100 having a thickness in the z-direction, Hall elements $100l_1$ and $100l_2$ and Hall elements $100r_1$ and $100r_2$ which are provided on the substrate 100 and have detection surfaces in parallel with the xy plane and whose detecting direction is a magnetic sensing direction $D_{sz}$ as magnetic detection elements, a magnetic concentrator 101l which is provided so as to partially overlap the Hall elements $100l_1$ and $100l_2$ to convert the magnetic flux in the x direction into the z direction in order to be detected by the Hall elements $100l_1$ and $100l_2$, a magnetic concentrator 101r which is provided so as to partially overlap the Hall elements $100r_1$ and $100r_2$ to convert the magnetic flux in the x direction into the z direction in order to be detected by the Hall elements $100r_1$ and $100r_2$, and a signal processor (not shown) for processing signals output from the Hall elements $100l_1$, $100l_2$, $100r_1$, and $100r_2$. It should be noted that the x direction is the direction perpendicular to the rotation axis direction and a radial direction of the rotatable body 3, and the z direction is the rotation axis direction of the rotatable body 3.

The magnetic sensor 1 detects magnetic flux density in magnetic sensing directions $D_{sx}$ and $D_{sz}$ by the Hall elements $100l_1$ and $100l_2$ and the magnetic concentrator 101l, and detects the magnetic flux density in the magnetic sensing directions $D_{sx}$ and $D_{sz}$ by the Hall elements $100r_1$ and $100r_2$ and the magnetic concentrator 101r.

To be specific, the magnetic sensor 1 obtains an output proportional to the magnetic flux density in the magnetic sensing direction $D_{sx}$ by calculating the difference between the outputs of the Hall elements $100l_1$ and $100l_2$ and the difference between the outputs of the Hall elements $100r_1$ and $100r_2$. Further, the magnetic sensor 1 obtains the output proportional to the magnetic flux density in the magnetic sensing direction $D_{sz}$ by summing up the outputs of the Hall elements $100l_1$ and $100l_2$ and summing up the outputs of the Hall elements $100r_1$ and $100r_2$. The details will be described in "Magnetism Detecting Operation".

A sensor MLX90371 made by Melexis, for example, may be used for the magnetic sensor 1 and the distance between the Hall elements $100l_1$ and $100l_2$ and the distance between the Hall elements $100r_1$ and $100r_2$ may be 0.2 mm, the thickness of the package mold in the z direction may be 1.5 mm, the width in the x direction may be 5.2 mm, and the width in the y direction may be 4.5 mm. A distance $d_s$ between the magnetic concentrators 101l and 101r of the magnetic sensor 1 may satisfy $d_s$=2 mm and permalloys can be used. In addition, the magnetic sensor 1 may be provided with a Hall element for detecting the magnetic flux density in the y direction.

Other types of elements such as an MR element may be used for the magnetic sensor 1 if the detection direction is the x direction, and a multi-axis magnetic detection IC in which respective magnetic detection elements are arranged in a plurality of axis directions may be used if the detection directions include the x direction.

Figure 9:
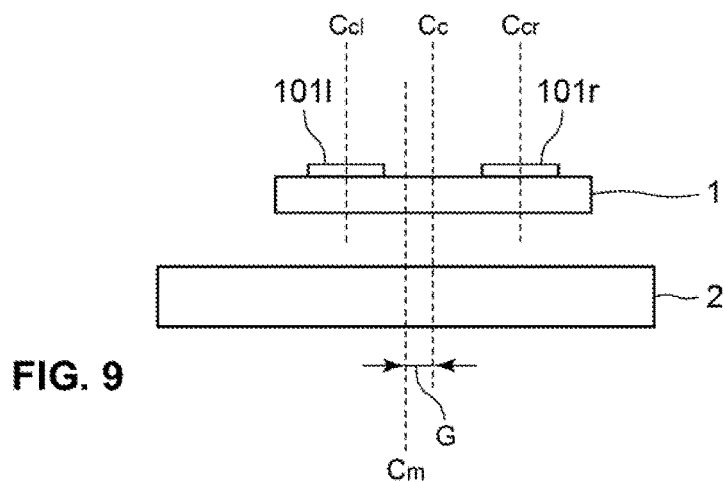
FIG. 9 is a schematic view for illustrating the arrangement of the magnetic sensor and the magnet.

FIG. 9 is a schematic view for illustrating the arrangement of the magnetic sensor 1 and the magnet 2.

The magnetic sensor 1 is ideally manufactured by causing a detection center $C_c$ of the magnetic sensor 1 to coincide with a center $C_m$ on the outer shape of the magnet 2 and molding the magnetic sensor 1 with a resin or the like. However, it is assumed that the detection center $C_c$ is shifted from the center $C_m$ by a gap G due to a manufacturing error or the like. The gap G has a size of 0.25 mm as an example. Further, it is assumed that the center of detection by the Hall elements $100l_1$ and $100l_2$ and the magnetic concentrator 101l is $C_{cl}$, and the center of detection by the Hall elements $100r_1$ and $100r_2$ and the magnetic concentrator 101r is $C_{cr}$.

(Operation of Rotation Detection Device)

Next, the operation according to the embodiment will be described with reference to FIGS. 1 to 13. First, the magnetism detecting operation of the magnetic sensor 1 will be described, and next, the rotation detecting operation in which the rotation detection device 5 detects the rotation of the rotatable body 3 will be described, and then the calibration operation of the rotation detection device 5 will be described.

(Magnetism Detecting Operation)

Figure 4:
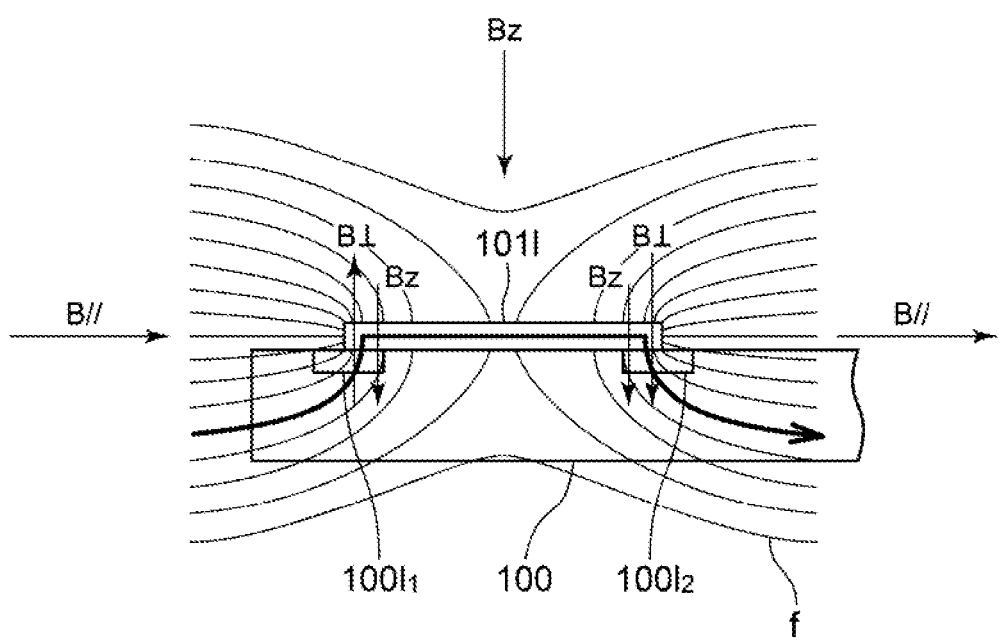
FIG. 4 is a schematic view for illustrating the operation of the magnetic sensor of the rotation detection device according to embodiments of the present invention.

FIG. 4 is a schematic view for illustrating the operation of the magnetic sensor 1 of the rotation detection device 5.

The magnetic flux transmitting through the magnetic sensor 1 is sensed by the Hall elements $100l_1$, $100l_2$, $100r_1$, and 100$r_2$ for outputting signals proportional to the magnetic flux density. The magnetic flux detected by the Hall elements 100$l_1$ and 100$l_2$ will be described below as a representative, and description for the Hall elements 100$r_1$ and 100$r_2$ is similar thereto.

A parallel component $B_\parallel$ of a magnetic flux f is induced in the magnetic concentrator 101$l$ so as to be converted into a vertical component $B_\perp$ having the magnitude of the magnetic flux density proportional to that of the parallel component $B_\parallel$, and is measured by a pair of Hall elements 100$l_1$ and 100$l_2$. A vertical component $B_z$ is also measured by the pair of Hall elements 100$l_1$ and 100$l_2$.

In other words, the Hall element 100$l_1$ on the left side of FIG. 4 measures "$B_\perp - B_z$", while the Hall element 100$l_2$ on the right side of FIG. 4 measures "$-B_\perp - B_z$". Therefore, 2$B_\perp$ is obtained by calculating the difference between the output of the Hall element 100$l_1$ and the output of the Hall element 100$l_2$, and then $-2B_z$ is obtained by calculating the sum thereof.

In the following, the magnetic sensor 1 obtains the difference between the output of the Hall element 100$l_1$ and the output of the Hall element 100$l_2$ (hereinafter referred to as 2$B_{x\perp l}$) and a sum 2$B_{zl}$ of the output of the Hall element 100$l_1$ and the output of the Hall element 100$l_2$, and similarly obtains 2$B_{x\perp r}$ and 2$B_{zr}$ from the Hall elements 100$r_1$ and 100$r_2$. Further from differences of these, the magnetic sensor 1 obtains $\Delta B_x = B_{x\perp l} - B_{x\perp r}$ and $\Delta B_z = B_{zl} - B_{zr}$. Based on the $\Delta B_x$ and $\Delta B_z$, the magnetic sensor 1 detects the rotation of the rotatable body 3 as described below in "Rotation Detecting Operation"

(Rotation Detecting Operation)

FIG. 5, (a) to (e), are schematic diagrams showing magnetic fields formed by a magnet.

Figure 5A:
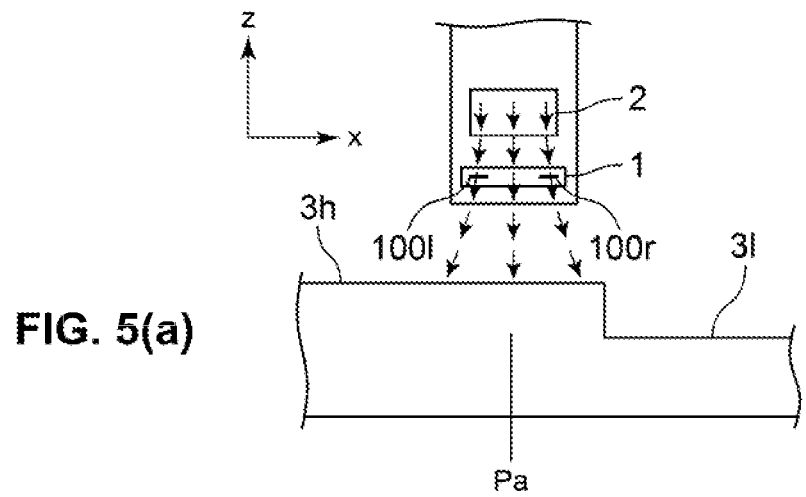
FIG. 5, (a) to (e), are schematic views showing a magnetic field formed by a magnet.

As shown in FIG. 5(a), the magnetic flux induced from the magnet 2 to the tooth tip 3$h$ of the rotatable body 3 when the magnetic sensor 1 is at a position $P_a$ of the rotatable body 3 ($\theta=0°$) is indicated by the arrows in the figure. Since the x components of the magnetic flux densities detected by the Hall elements 100$l_1$ and 100$l_2$ (hereinafter collectively referred to as "Hall element 100$l$") and the Hall elements 100$r_1$ and 100$r_2$ (hereinafter collectively referred to as "Hall element 100$r$") of the magnetic sensor 1 exhibit positive and negative values, the difference $\Delta B_x$ is largest in the rotation range of the rotatable body 3. Since the z components of the magnetic flux densities detected by the Hall elements 100$r_1$ and 100$r_2$ are the same, the difference $\Delta B_z$ of the z component is zero.

Figure 5B:
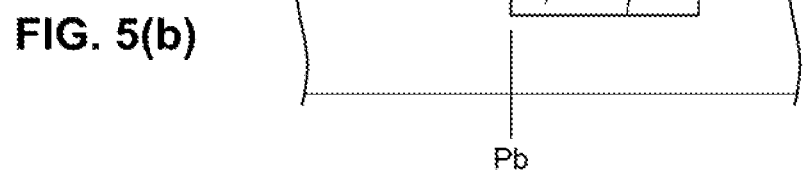

Next, as shown in FIG. 5(b), since the magnetic flux in the left half of the figure is attracted to the tooth tip 3$h$, and the right half of the magnetic flux forms a magnetic field which is directed toward the tooth bottom 3$l$ when the magnetic sensor 1 is at a position $P_b$ of the rotatable body 3 ($\theta=90°$), the magnetic flux density detected by the Hall element 100$l$ is the same as that shown in FIG. 5(a), but the magnetic flux detected by the Hall element 100$r$ is smaller than that shown in FIG. 5(a), and the difference between the x components of the magnetic flux densities detected by the magnetic sensor 1 is smaller than that shown in FIG. 5(a). Further, since the z component of the magnetic flux density detected by the Hall element 100$r$ is smaller than that in FIG. 5(a), the difference $\Delta B_z$ of the z component becomes smaller in the negative direction than in the state of $\theta=0°$.

Figure 5C:
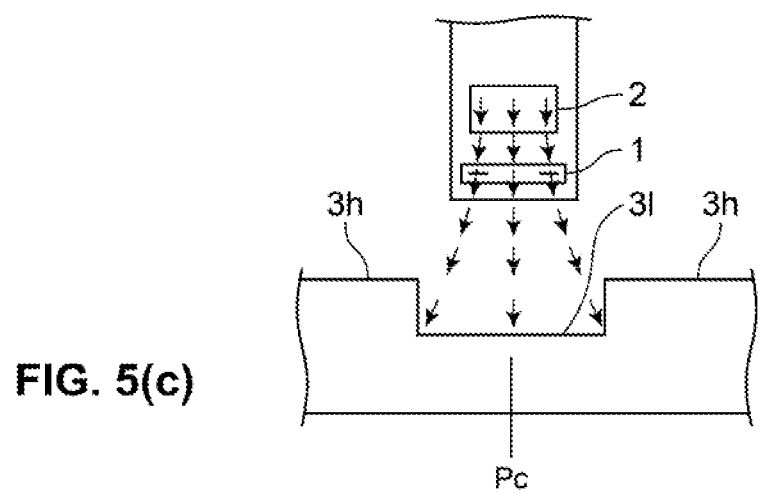

Next, as shown in FIG. 5(c), when the magnetic sensor 1 is at a position $P_c$ of the rotatable body 3 ($\theta=180°$), the magnetic flux attracted from the magnet 2 to the tooth bottom 3$l$ of the rotatable body 3 is as shown by the arrows in the figure and the x components of the magnetic flux densities detected by the Hall elements 100$l$ and 100$r$ exhibit positive and negative values, but the absolute value of each is smaller than that of FIG. 5(a). Therefore, the difference of the x components of the magnetic flux densities is minimized. Further, since the z components of the magnetic flux densities detected by the Hall elements 100$l$ and 100$r$ are the same, the difference $\Delta B_z$ of the z component is zero.

Figure 5D:
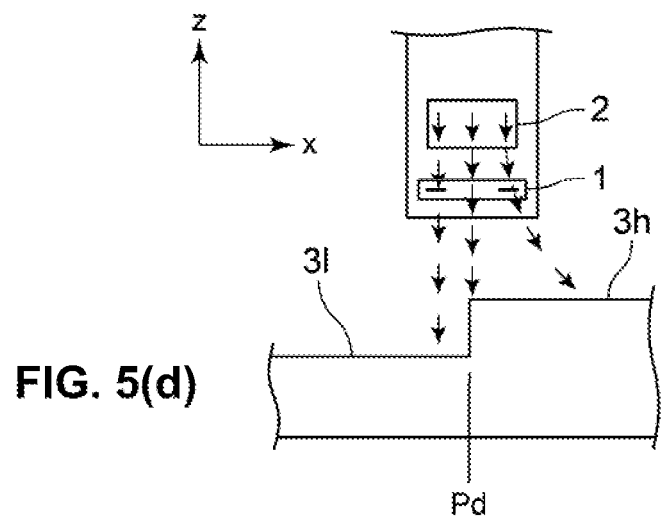

Next, as shown in FIG. 5(d), when the magnetic sensor 1 is at a position $P_d$ of the rotatable body 3 ($\theta=270°$), the state around the magnetic sensor 1 is reversed in the left-right direction from the state in FIG. 5(b), and the difference between the x components of the magnetic flux densities detected by the magnetic sensor 1 is the same as in the case of FIG. 5(b). The difference between the z components of the magnetic flux densities detected by the magnetic sensor 1 is the same as one obtained by positive/negative inversion in the case of FIG. 5(b).

Figure 5E:
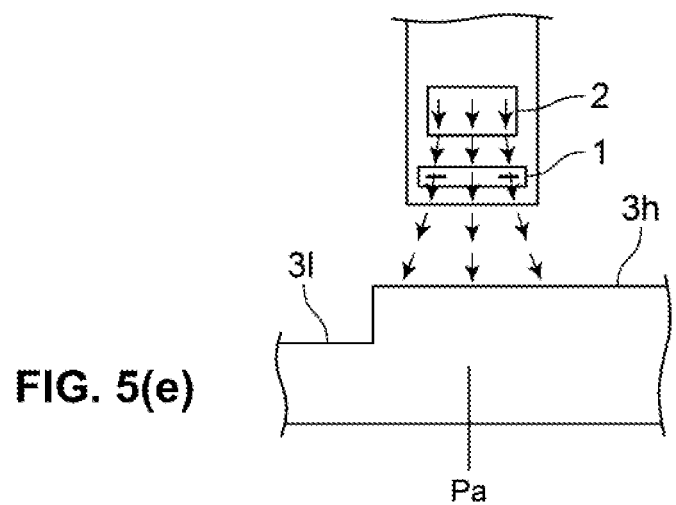

As shown in FIG. 5(e), when the rotatable body 3 has made one revolution and the magnetic sensor 1 is again at the position $P_a$ of the rotatable body 3 ($\theta=360°$), the state becomes the same as in FIG. 5(a) and the difference between the x components of the magnetic flux densities detected by the magnetic sensor 1 is largest in the rotation range of the rotatable body 3. In addition, the difference of the z component $\Delta B_z$ is zero.

However, the magnetic sensor 1 detects the magnetic flux density as shown above only in the case where the detection center $C_c$ of the magnetic sensor 1 and the center $C_m$ of the magnet 2 shown in FIG. 9 coincide with each other and thus in the case of the gap G=0, and offsets are generated in $\Delta B_x$ and $\Delta B_z$ in the case of G≠0.

Figure 6:
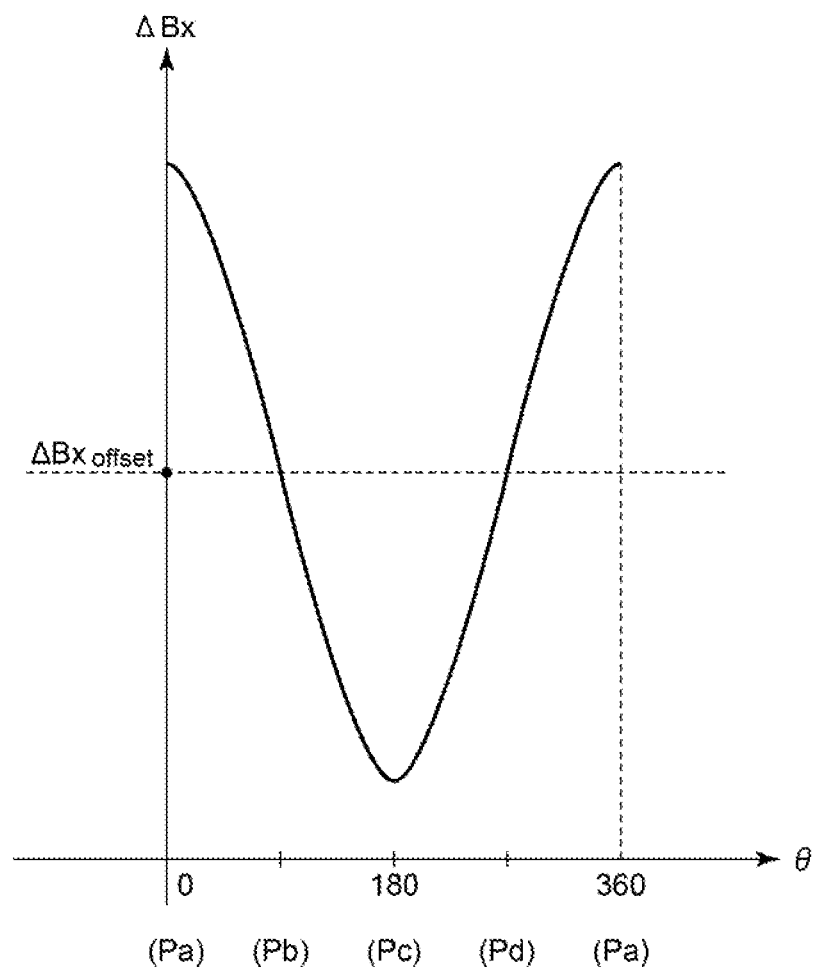
FIG. 6 is a graph showing a change example in magnetic flux density in the x direction, detected by the magnetic sensor as a gear rotates.
Figure 7:
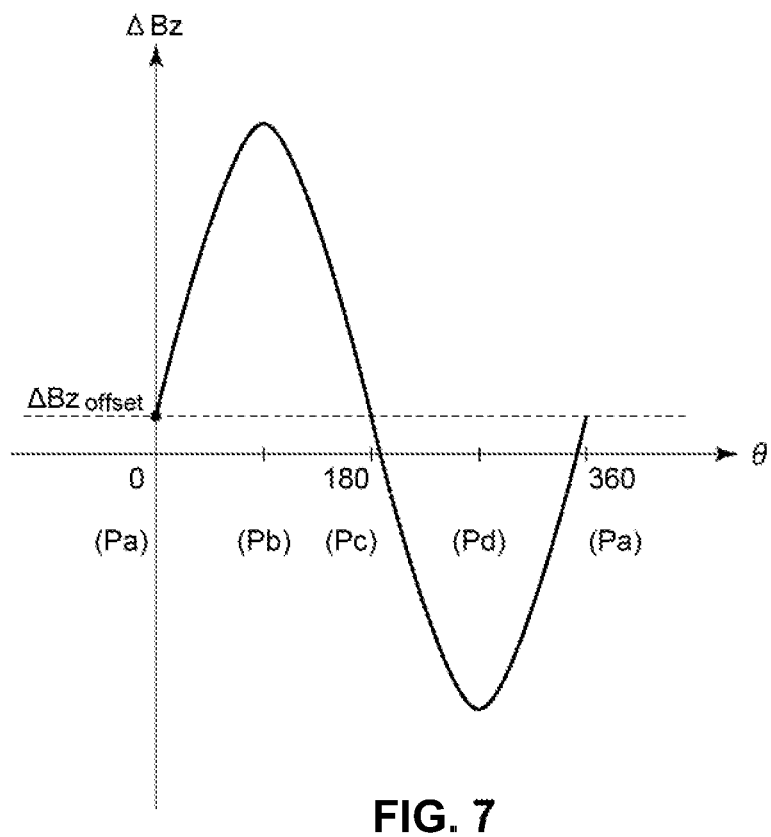
FIG. 7 is a graph showing a change example in magnetic flux density in the z direction, detected by the magnetic sensor as the gear rotates.

As described above, the magnetic flux density detected by the magnetic sensor 1 is plotted as shown in FIGS. 6 and 7 below in consideration of the offsets caused by the gap G.

Figure 8:
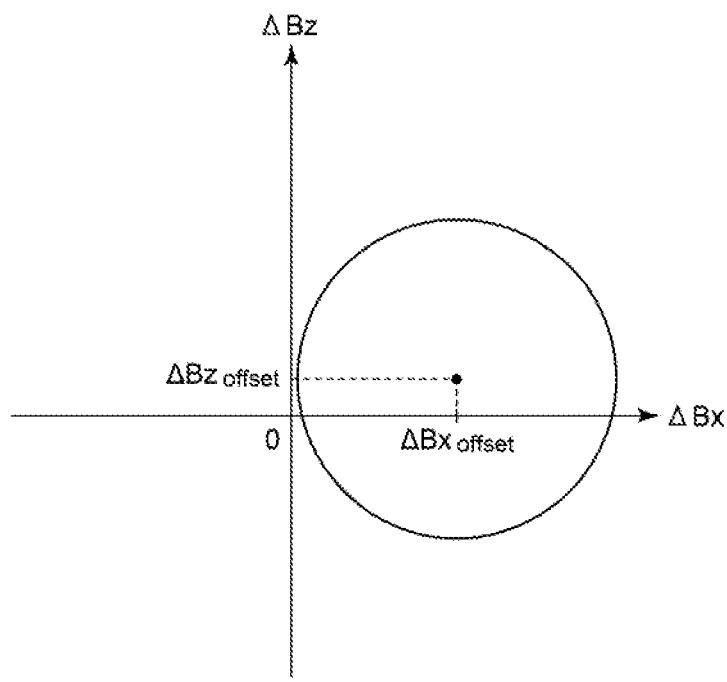
FIG. 8 is a graph showing a change example in magnetic flux density in the x direction and the z direction, detected by the magnetic sensor as the gear rotates.

FIG. 6 is a graph showing a change example in the difference of magnetic flux densities in the x direction, detected by the magnetic sensor as the gear rotates. FIG. 7 is a graph showing a change example in the difference of magnetic flux densities in the z direction, detected by the magnetic sensor as the gear rotates. FIG. 8 is a graph showing a change example in the difference of the magnetic flux densities in the x direction and z direction, detected by the magnetic sensor as the gear rotates.

As shown in FIG. 6, the difference $\Delta B_x$ of the x components of the magnetic flux densities detected by the magnetic sensor 1 is maximum at the position of the rotatable body 3 at $P_a$ ($\theta=0°$, 360°) and is minimum at the intermediate point $P_c$ ($\theta=180°$) of the change amount. It should be noted that $\Delta B_{xoffset}$ is generated due to the fact that the outward open magnetic field is always biased for the Hall elements 100$l$ and 100$r$, and that the gap G≠0 is satisfied. Incidentally, since the magnetic properties of the magnet 2 depend on the temperature, the value of $\Delta B_{xoffset}$ also depends on the temperature.

As shown in FIG. 7, the difference $\Delta B_z$ of the z components of the magnetic flux densities detected by the magnetic sensor 1 is zero when the position of the rotatable body 3 is at $P_a$ ($\theta=0°$, 360°) and at the intermediate point $P_c$ ($\theta=180°$), and is maximum at the transition point $P_b$ ($\theta=90°$), and minimum at the transition point $P_d$ ($\theta=270°$). Incidentally, $\Delta B_{zoffset}$ is generated, since the gap G≠0 is satisfied in a state where an outward open magnetic field is always biased to the Hall elements 100$l$ and 100$r$ so that the magnetic flux density in the z direction, detected by the Hall element 100$l$ and the magnetic flux density in the z direction, detected by the Hall element 100$r$ are not equal to each other. Incidentally, since the magnetic properties of the magnet 2 depend on the temperature, the value of $\Delta B_{zoffset}$ also depends on the temperature.

As shown in FIG. 8, assuming that the vertical axis indicates $\Delta B_z$ and the horizontal axis indicates $\Delta B_x$, a circle is plotted with the center coordinates ($\Delta B_{xoffset}$, $\Delta B_{zoffset}$). Incidentally, the amplitudes of $\Delta B_x$ and $\Delta B_z$ shown in FIGS. 6 and 7 are appropriately normalized.

When the center coordinates ($\Delta B_{xoffset}$, $\Delta B_{zoffset}$) of the circle shown in FIG. 8 can be corrected to become the origin, the rotation angle θ of the rotatable body 3 can be obtained by calculating arctan ($\Delta B_z'/\Delta B_x'$) from $\Delta B_x'$ and $\Delta B_z'$ having been corrected. Accordingly, the following describes the calibration operation corresponding to this correction.

(Calibration Operation)

Figure 10A:
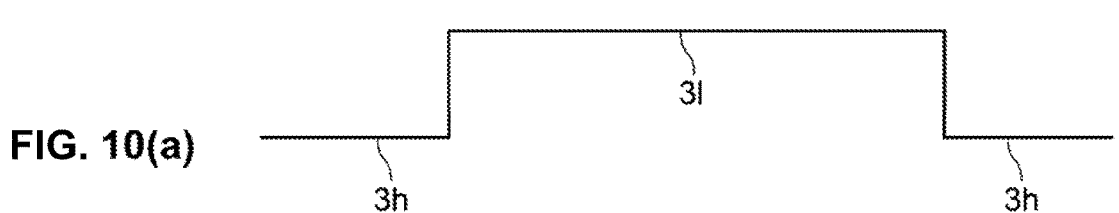
FIGS. 10A and 10B are graphs showing the change in magnetic flux density detected by the magnetic sensor as the gear rotates.
Figure 10B:
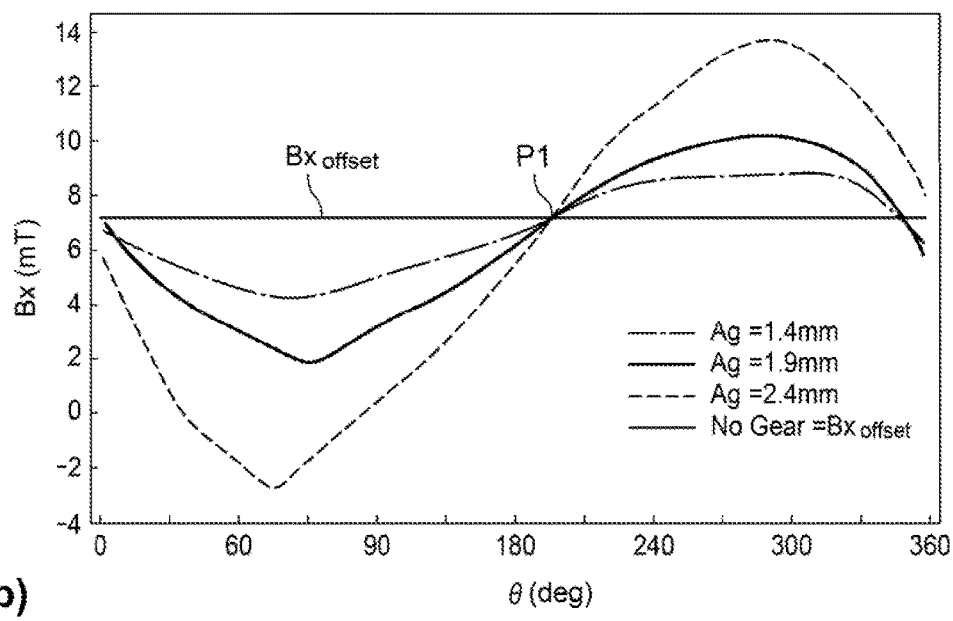
Figure 13:
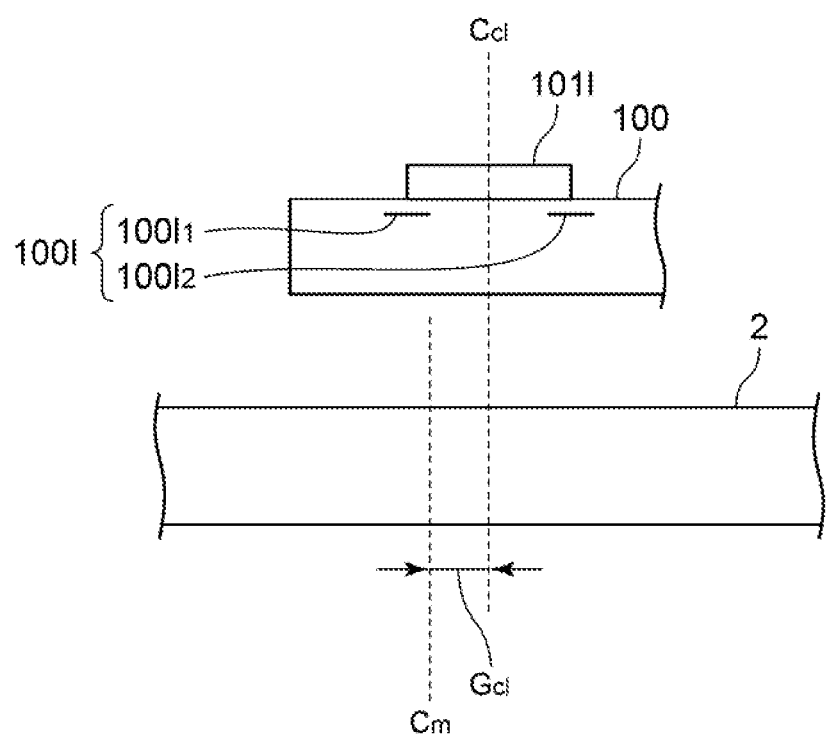
FIG. 13 is a schematic view for illustrating arrangement of a Hall element and the magnet.

Before the description of the calibration operation, why the offsets occur will be explained. FIGS. 10(a) and 10(b) are graphs showing the changes in magnetic flux density detected by the magnetic sensor as the gear rotates. FIG. 13 is a schematic view for illustrating the arrangement of the Hall element 100l and the magnet 2.

Assuming that the gap $G_{cl}$ is generated when the detection center $C_{cl}$ of the Hall element 100l and the magnetic concentrator 101l is attempted to coincide with the center $C_m$ of the magnet 2 as shown in FIG. 13, the magnetic flux density detected by the Hall element 100l is as shown in FIGS. 10(a) and 10(b).

Since a magnetic field symmetrical with respect to the z-axis is formed when the center of the tooth bottom 3l of the rotatable body 3 is closest to the Hall element 100l as shown in FIG. 10(a), the x component of the magnetic flux density detected by the Hall element 100l becomes zero in the case of the gap $G_{cl}=0$ as shown in FIG. 10(b). However, the x component has a finite value ($B_{xoffset}$) in the case of $G_{cl}\neq 0$. As the rotatable body 3 rotates in the rotating direction $D_r$, so that the tooth tip 3h approaches the Hall element 100l, the x component leans to the negative side, and the x component of the magnetic flux density detected by the Hall element 100l exhibits a negative value. Further, in the state where the tooth tip 3h is closest to the Hall element 100l, a magnetic field symmetrical with respect to the z axis is formed, and the x component of the magnetic flux density detected by the Hall element 100l becomes zero if the gap $G_{cl}=0$ is satisfied. However, the x component has a finite value ($B_{xoffset}$) when $G_{cl}\neq 0$ is satisfied.

Further, when the tooth tip 3h passes over the Hall element 100l as the rotatable body 3 rotates in the rotating direction $D_r$, the x component changes from negative to positive in accordance with the passing timing, and then as the tooth tip 3h approaches the most distant position from the Hall element 100l, the x component returns to $B_{xoffset}$.

As shown in FIGS. 10(a) and 10(b), when the tooth passes over the Hall element 100l as the rotatable body 3 rotates, the output signal level of the Hall element 100l becomes minimum (solid line, $A_{gh}$=1.9 mm) at the timing of change of the passing portion of the tooth from the tooth tip 3h to the tooth bottom 3l. In addition, the output signal level of the Hall element 100l is maximum at the timing of change from the tooth bottom 3l to the tooth tip 3h.

Next, the case where the air gap $A_{gh}$ is changed will be described. Even in the cases where the air gap $A_{gh}$ is for instance 1.4 mm and 2.4 mm, when the tooth passes over the Hall element 100l as the rotatable body 3 rotates, the output signal level of the Hall element 100l is minimized at the timing of change of the passing tooth portion from the tooth tip 3h to the tooth bottom 3l, and the output signal level of the Hall element 100l is maximized at the timing of change of the passing tooth portion from the tooth bottom 3l to the tooth tip 3h, as shown in FIGS. 10(a) and 10(b). This is a phenomenon that occurs together with some error regardless of the numerical value of the air gap $A_{gh}$.

In the state where the tooth bottom 3l is closest to the Hall element 100l, a magnetic field symmetrical with respect to the z axis is formed on the Hall element 100l, and the timings when the x component of the magnetic flux density detected by the Hall element 100l becomes $B_{xoffset}$ coincide to one another, even when the air gap $A_{gh}$ is different (coincidence point $P_1$, FIG. 10(b)).

On the other hand, in the state where the tooth tip 3h is closest to the Hall element 100l, the magnetic field symmetrical with respect to the z axis is formed on the Hall element 100l, and the timing when the x component of the magnetic flux density detected by the Hall element 100l becomes $B_{xoffset}$ is shifted due to the difference of the air gap $A_{gh}$.

Further, on the other hand, since the coincidence point $P_1$ is the same as in the magnetic flux density detected by the Hall element 100l when the air gap $A_{gh}$ is infinite, $B_{xoffset}$ is obtained from the output of the Hall element 100l in the state where the rotatable body 3 does not exist.

Since $B_x$ is obtained from the difference between the outputs of the Hall elements $100l_1$ and $100l_2$, and $\Delta B_z$ is obtained from the difference between the outputs of the Hall elements 100l and 100r, to get back to talking about the state shown in FIG. 9 again, $\Delta B_{zoffset}$ is obtained from the difference $\Delta B_z$ between the outputs of the magnetic sensor 1 in the state where the rotatable body 3 does not exist, from a method similar to that described above with reference to FIGS. 10(a), 10(b) and 13 (first correction value).

By correcting $\Delta B_z$ shown in FIG. 8 by using $\Delta B_{zoffset}$ acquired by the above method, the output described below and shown in FIG. 11 can be obtained.

Figure 11:
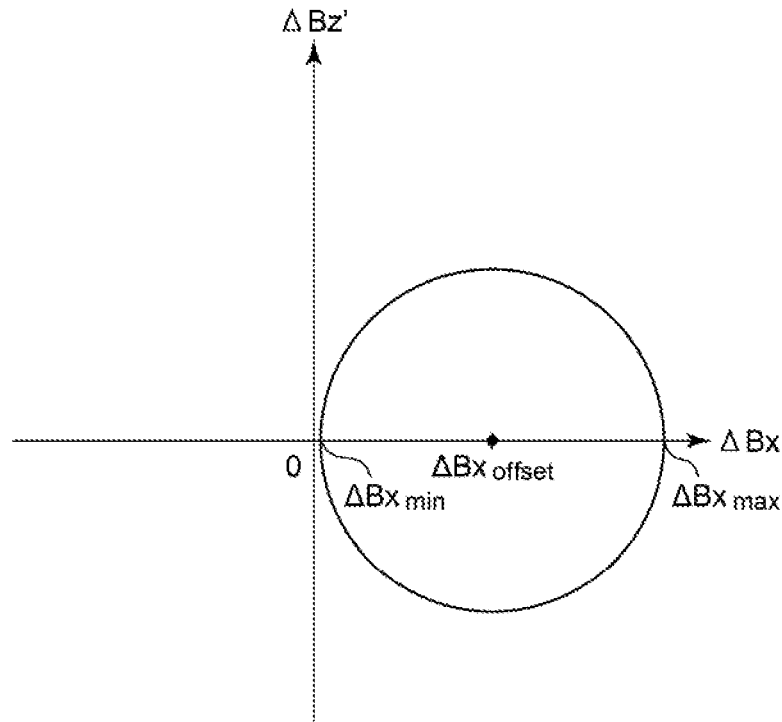
FIG. 11 is a graph showing a change example in magnetic flux density in the x direction and the z direction, detected by the magnetic sensor as the gear rotates, with the offset in the z direction corrected.

FIG. 11 is a graph showing a change example in the magnetic flux density in the x direction and z direction, detected by the magnetic sensor, as the gear rotates, with the offset in the z direction corrected.

The differences $\Delta B_x$ and $\Delta B_z'$ form a circle having the center on the $\Delta B_x$ axis. Accordingly, $\Delta B_{xoffset}$ is obtained by acquiring the intermediate point from $\Delta B_{xmax}$ and $\Delta B_{xmin}$ obtained by making one revolution of the rotatable body 3 (second correction value).

Figure 12:
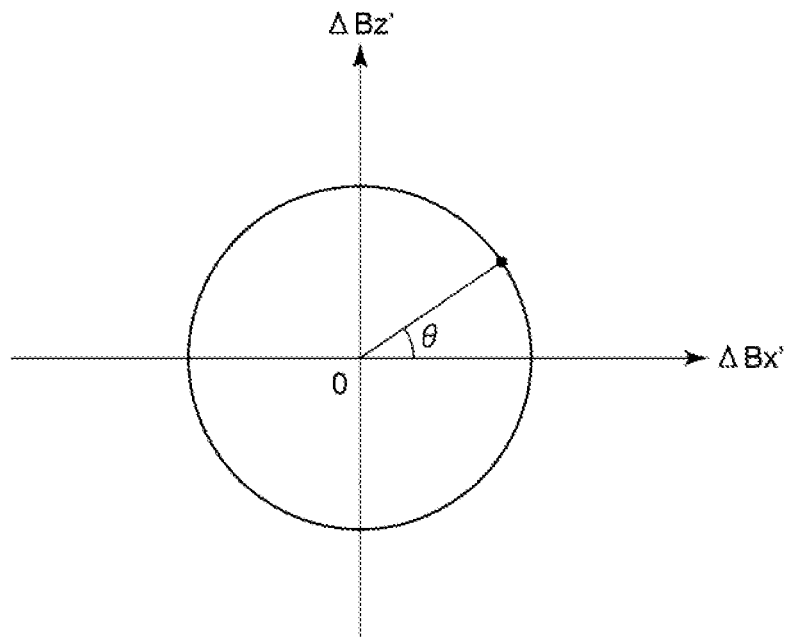
FIG. 12 is a graph showing a change example in the magnetic flux density in the x direction and the z direction, detected by the magnetic sensor as the gear rotates, with the offset in the x direction corrected.

By correcting $\Delta B_x$ shown in FIG. 11 by using $\Delta B_{xoffset}$ acquired by the above method, the output shown in FIG. 12 is obtained as described below.

FIG. 12 is a graph showing a change example in magnetic flux density in the x direction and z direction, detected by the magnetic sensor, as the gear rotates, with the offsets in the x direction corrected.

As shown in FIG. 12, the coordinates of the circle center ($\Delta B_{xoffset}$, $\Delta B_{zoffset}$) can be corrected to be the origin by the above-described calibration operation. Arctan ($\Delta B_z'/\Delta B_x'$) is calculated from the corrected $\Delta B_x'$ and $\Delta B_z'$ to obtain the rotation angle θ of the rotatable body 3.

(Effect of the Embodiment)

According to the above-described embodiment, since the rotatable body 3 having a shape with one tooth tip and one tooth bottom is used, the rotation angle θ can be continuously detected.

Since $\Delta B_{zoffset}$ is determined from the output value of the magnetic sensor 1 when the air gap $A_{gh}$ is infinite, $\Delta B_z$ has been corrected to $\Delta B_z$ at the time of shipment from the factory, and $\Delta B_{xoffset}$ has only to be obtained to adapt the magnetic sensor 1 to each rotatable body 3 so that the calibration of the rotation detection device 5 is simplified.

[Other Embodiments]

It should be understood that the present invention is not limited to the above-described embodiment, and various modifications are possible without departing from the spirit of the present invention. For example, when the assembly cannot make the magnetic sensing direction $D_{sz}$ of the rotation detection device 5 accurately coincide with the rotation axis of the rotatable body 3, $\Delta B_x$ and $\Delta B_z$ may be appropriately corrected by the signal processor of the magnetic sensor 1. Further, Hall elements arranged side by side in the y direction can also be provided, and $\Delta B_x$ and $\Delta B_z$ may be corrected using the outputs of these Hall elements.

Since the sensor, magnet, and gear of the above-described embodiment are examples, as long as the functions of the position detection are not impaired, and within a range that does not change the gist of the present invention, these may be appropriately selected and changed to a new combination.

The invention claimed is:

1. A rotation detection device comprising:
   a rotatable body made of a soft magnetic material and having a tooth tip and a tooth bottom on planes normal to a direction of a rotation axis, the tooth tip being provided in a range of a first rotation angle, the tooth bottom being provided in a range other than the range of the first rotation angle;
   a magnet configured to form a magnetic field toward tooth surfaces of the tooth tip and the tooth bottom of the rotatable body;
   a magnetic detection element disposed at a position between the rotatable body and the magnet and other than on the rotation axis of the rotatable body, and configured to detect magnetic flux densities in the direction of the rotation axis of the rotatable body at at least two positions; and
   a magnetic sensor having a signal processor configured to calculate a rotation angle of the rotatable body in accordance with a difference between magnetic flux densities in the direction of the rotation axis of the rotatable body, detected at the at least two positions and a difference between magnetic flux densities in a direction perpendicular to the direction of the rotation axis and a radial direction of the rotatable body, detected at the at least two positions by the magnetic detection element;

wherein the signal processor of the magnetic sensor is configured to set a first correction value based on a signal output from the magnetic detection element when a distance between the tooth surfaces of the rotatable body and the magnetic detection element is infinite, to make correction of an output value of the magnetic detection element by using the first correction value, to set a second correction value based on an amplitude of the output value when one or more revolutions of the rotatable body are made after the correction of the output value, to make correction of the difference between the magnetic flux densities in the direction of the rotation axis of the rotatable body, detected at the at least two positions by the magnetic detection element, by using the first correction value, to make correction of the difference between the magnetic flux densities in the direction perpendicular to the direction of the rotation axis and the radial direction of the rotatable body, detected at the at least two positions, by using the second correction value, and to calculate the rotation angle of the rotatable body in accordance with a value obtained by the correction of the difference by using the first correction value and a value obtained by the correction of the difference by using the second correction value.

* * * * *